United States Patent [19]

Ito

[11] Patent Number: 4,769,600
[45] Date of Patent: Sep. 6, 1988

[54] HOLDING MEMBER FOR SENSOR OF MAGNETIC ROTARY ENCODER

[75] Inventor: Eiji Ito, Furukawa, Japan

[73] Assignee: Alps Electric Co., Ltd., Japan

[21] Appl. No.: 15,883

[22] Filed: Feb. 18, 1987

[30] Foreign Application Priority Data

| May 29, 1986 | [JP] | Japan | 61-80217[U] |
| Jul. 4, 1986 | [JP] | Japan | 61-102144[U] |
| Aug. 18, 1986 | [JP] | Japan | 61-125329[U] |
| Aug. 26, 1986 | [JP] | Japan | 61-128828[U] |

[51] Int. Cl.⁴ ............................................. G01R 33/00
[52] U.S. Cl. ..................................... 324/262; 324/208
[58] Field of Search ............... 324/207, 208, 226, 235, 324/251, 252, 260–262; 338/32 R, 32 H; 367/427; 248/DIG. 6

[56] References Cited

U.S. PATENT DOCUMENTS

| 4,053,826 | 10/1977 | Wasawa et al. | 324/208 |
| 4,274,057 | 6/1981 | Ito et al. | 324/174 |
| 4,319,188 | 3/1982 | Ito et al. | 324/208 X |
| 4,349,814 | 9/1982 | Akehurst | 324/251 X |
| 4,351,191 | 9/1982 | Iwasaki | 324/208 X |
| 4,663,853 | 5/1987 | Indo et al. | 324/208 X |
| 4,694,688 | 9/1987 | Takahashi et al. | 324/208 X |

Primary Examiner—Reinhard J. Eisenzopf
Assistant Examiner—Warren S. Edmonds
Attorney, Agent, or Firm—Guy W. Shoup; Leighton K. Chong; Paul J. Winters

[57] ABSTRACT

A holding member for holding a magnetic sensor at a position opposed to a rotary magnetic scale for magnetic signal detection in a magnetic rotary encoder is made by first cutting from a metal or synthetic resin sheet a single sheet member having unique extensions, projections, holes or apertures along and near its outer margin, and subsequently bending the sheet member along predetermined lines to form a self-standing support body and use original cut margins of the extensions and projections as reference or guide surfaces which define proper contacting relationships with the magnetic sensor and with a base plate on which the holding member is fixed.

4 Claims, 11 Drawing Sheets

HOLDING MEMBER FOR SENSOR OF MAGNETIC ROTARY ENCODER

FIELD OF THE INVENTION

This invention relates to a magnetic rotary encoder, and more particularly to a holding member to hold a magnetic sensor at a position opposed to a rotary magnetic scale for magnetic signal detection.

BACKGROUND OF THE INVENTION

U.S. Pat. No. 4,274,053 and U.S. Pat. No. 4,319,188; for example, disclose magnetic rotary encoders using a magnetic sensor made by a known magnetic resistance effect element (MR sensor) in the form of a thin sheet provided on a plate.

These magnetic rotary encoders are of great importance in the market of rotary detectors due to their advantages including a merit that the number of output pulses per revolution is obtained at a lower cost than in an optical rotary encoder.

Figure 16:
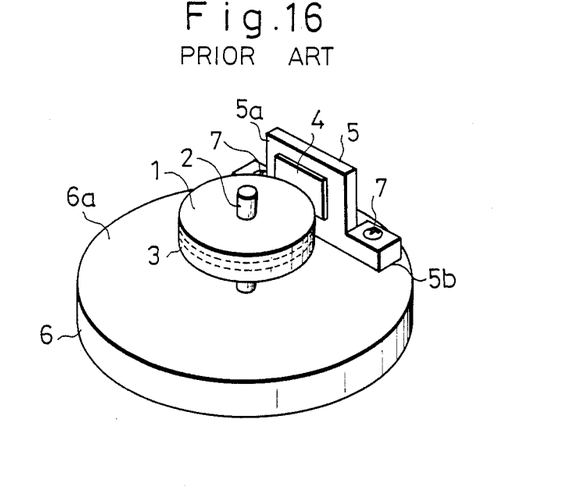
FIGS. 16 through 21 illustrate prior art arrangements respectively.

One of the prior art magnetic circumference-reading rotary encoder is shown in FIG. 16 in a schematic form. In the same drawing, reference numeral 1 refers to a drum, 2 to a rotary shaft, 3 to a magnetized pattern, 4 to a magnetic sensor, 5 to a holding member and 6 to a chassis.

The drum 1 made from a magnetic material is driven by a motor or other means (not shown) rotatably about the rotary shaft 2, and has the magnetized pattern 3 provided on the circumferential surface thereof by a magnetic recording technology. The magnetized pattern 3 includes a number of separate parts spaced at an interval and aligned so that adjacent parts are opposite in polarity such as N, S, S, N, N, S, S, N, . . . . The magnetic sensor 4 is a known member made of magnetic resistance effect elements and is fixed on a sensor fixing surface 5a of the holding member 5 by an interval and aligned so that adjacent magnetic polarity adhesive or other means. The holding member 5 is made from aluminum or other metal or a synthetic resin material, and its bottom surface defines a mounting reference surface 5b which closely contacts a plane 6a of the chassis 6 when the holding member 5 is fixed to the chassis by bolts 7.

The magnetic sensor 4 is made of two magnetic resistance effect elements which are different in phase by $np+\frac{1}{4}p$ (n is an integer) with respect to each magnetic polarity pitch p of the magnetized pattern 3 on the drum 1, and are opposed to the magnetized pattern 3 so that directions of magnetic paths of the magnetic resistance effect elements intersect with the rotary shaft 2 at a right angle. Therefore, when the drum 1 rotates, individual magnetic resistance effect elements of the magnetic sensor 4 produce signals which are different in phase by 90 degrees.

In the aforegoing magnetic rotary encoder, with one rotation of the drum 1 in a predetermined direction, individual magnetic resistance effect elements of the magnetic sensor 4 supply continuous signals having 90 degrees phase difference. Amplification, demodulation, matching or other signal processing are effected to the continuous signals to obtain incremental pulses which represent a movement and a rotating direction of the drum 1.

Figure 17:
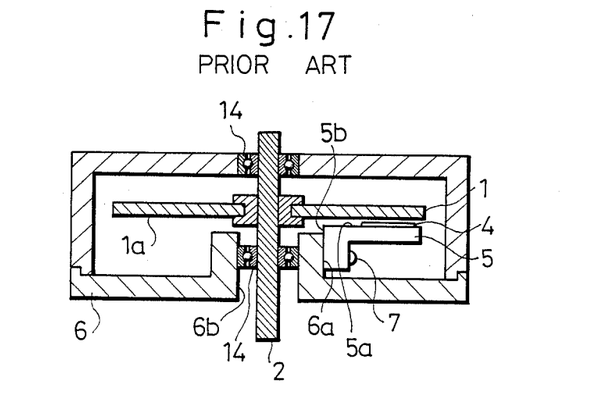
Figure 18:
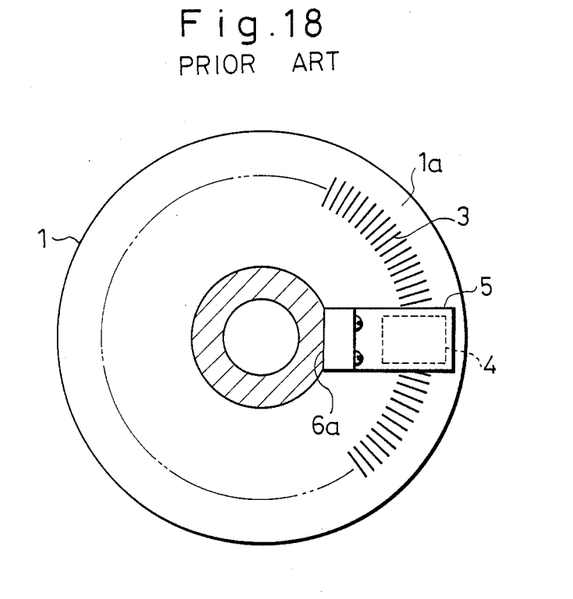

FIGS. 17 and 18 illustrate one form of prior art magnetic end-surface reading rotary encoder. In these drawings, reference numeral 1 refers to a disk, 2 to a rotary shaft, 3 to a magnetized pattern, 4 to a magnetic sensor, 5 to a holding member, 6 to a case, 7 to a bolt, and 14 to a bearing.

The disk 1 made from a magnetic material is rotatable about the rotary shaft 2 supported on the case 6 via the bearing 14. A planar disk surface 1a of the disk 1 is provided with the magnetized pattern 3 formed by a magnetic recording technology. As shown in FIG. 18, the magnetized pattern 3 includes a number of separate parts spaced at an pairs are opposite in polarity such as N, S, S, N, N, S, S, N . . . . The magnetic sensor 4 is a known member made of magnetic resistance effect elements, for example, and fixed on a sensor fixing surface 5a of the holding member 5 by an adhesive or other means. The holding member 5 is made from aluminum or other metal or a synthetic resin material, and its bottom surface defines a mounting reference surface 5b which contacts a plane 6a of the case 6 when the holding member is fixed to the case 6 by the bolts 7. The plane 6a is shaped to be parallel to a circumferential surface of a hole 6b when the hole 6b is formed in the center of the case 6, and an accurate parallel relationship is established between the surfaces in a relatively easy fashion. Therefore, a high accuracy is established in the parallel degree between the plane 6a and the rotary shaft 2 supported by the bearing 14 engaging the hole 6b, i.e. in the right angle degree between the plane 6a and the disk surface of the disk 1.

The magnetic sensor 4 is made of two magnetic resistance effect elements which are different in phase by $np+\frac{1}{4}p$ (n is an integer) with respect to each magnetic polarity pitch p of the magnetized pattern 3 on the disk 1 and are opposed to the magnetized pattern so that directions of magnetic paths of the magnetic resistance effect elements intersect with the rotary shaft 2 at a right angle. Therefore, when the disk 1 rotates, individual magnetic resistance effect elements of the magnetic sensor 4 produce signals which are different in phase by 90 degrees.

In the aforegoing magnetic rotary encoder, with one rotation of the disk 1 in a predetermined direction, individual magnetic resistance effect elements of the magnetic sensor 4 supply continuous signals having 90 degrees phase difference. Amplification, demodulation, matching or other signal processing are effected to the continuous signals to obtain incremental pulses which represent a movement and a rotating direction of the disk 1.

In the magnetic circumference-reading rotary encoder, it is necessary to maintain a uniform distance and parallel relationship between the magnetic sensor 4 and the circumferential surface of the drum 1 carrying the magnetized pattern 3. If they are slanted by an angle $\theta_1$ shown in FIG. 19 or by an angle $\theta_2$ shown in FIG. 20, the output of the magnetic sensor 4 drops, and unables an accurate positional detection. For this reason, high accuracies are required in the right angle arrangement between the plane 6a and the sensor fixing surface 5a of the bolding member 5 and in the evenness of the mounting reference surface 5b of the holding member 5.

In this connection, prior art technologies sometimes effect a cutting operation to aluminum or other metal material to make up the sensor fixing surface 5a and mounting reference surface 5b of the holding member 5, or sometimes make an approximate outer configuration by die-casting or injection molding and thereafter effect a cutting operation or other secondary working to finish the sensor fixing surface 5a and the mounting reference surface 5b of the holding member 5.

The prior art technologies, however, involve various problems that it is difficult to uniform the finished configurations of the sensor fixing surface 5a and the mounting reference surface 5b, that any unevenness of the finished mounting reference surface 5b, for example, causes an angular error of the holding member 5 fixed by the bolts 7 and the magnetic sensor 4 fixed on the holding member 5, and that a significant time required for the finishing operation causes an increase of the manufacturing cost.

Focusing at the time required for the finishing operation among other problems, one proposal to reduce the finishing time is to effect punching, bending or other press operation to a metal plate to make the holding member 5. However, a simple pressing operation cannot establish a sufficient finishing accuracy in the same degree as in the cutting operation, due to a spring-back after a bending operation. It is desired to establish finishing accuracies of the sensor fixing surface and mounting reference surface of the holding member by manufacturing the holding member by press-cutting operation.

Figure 19:
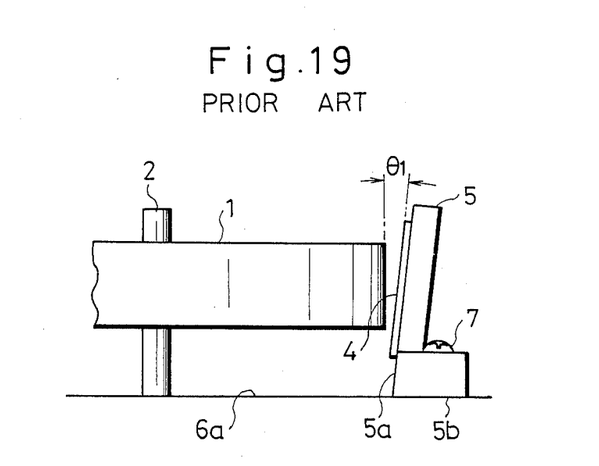
Figure 20:
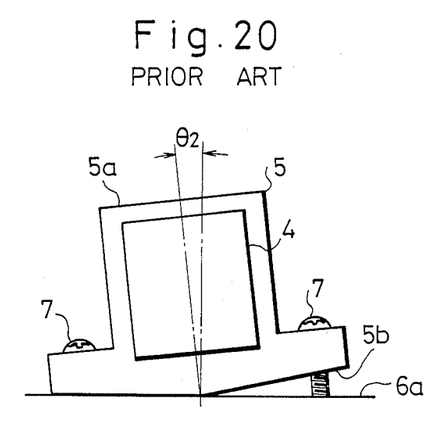

Also in the magnetic end-surface-reading rotary encoder, it is necessary to maintain a uniform distance and a parallel relationship between the magnetic sensor 4 and the disk surface 1a of the disk 1 carrying the magnetized pattern 3. If the parallelism between the disk surface 1a and the magnetic sensor 4 inclines by an angle $\theta_1$ as shown in FIG. 19, or if the center line of the magnetized pattern 3 inclines by an angle $\theta_2$ with respect to the azimuth angle of the magnetic sensor 4 as shown in FIG. 20, the output of the magnetic sensor 4 drops, and unables an accurate positional detection. For this reason, high accuracies are required in the right angle relationship between the plane 6a and the sensor fixing surface 5a of the holding member 5 and in the evenness of the mounting reference surface 5b of the holding member 5.

In this connection, prior art technologies sometimes effect a cutting operation to aluminum or other metal material to make up the sensor fixing surface 5a and mounting reference surface 5b of the holding member 5, or sometimes make an approximate outer configuration by die-casting or injection molding an thereafter effect a cutting operation or other secondary working to finish the sensor fixing surface 5a and the mounting reference surface 5b of the holding member 5.

The prior art technologies, however, involve various problems that it is difficult to uniform the finished configurations of the sensor fixing surface 5a and the mounting reference surface 5b, that any unevenness of the finished mounting reference surface 5b, for example, causes errors in the angle of the holding member 5 fixed by the bolt 7 and in the angle the magnetic sensor 4 fixed on the holding member 5, and that a significant time required for the finishing operation causes an increase of the manufacturing cost.

Focusing at the time required for the finishing operation among other problems, one proposal to reduce the finishing time is to effect punching, bending or other press operation to a metal plate to make the holding member 5. However, a simple pressing operation cannot establish a sufficient finishing accuracy in the same degree as in the cutting operation, due to a spring-back after a bending operation.

Figure 21:
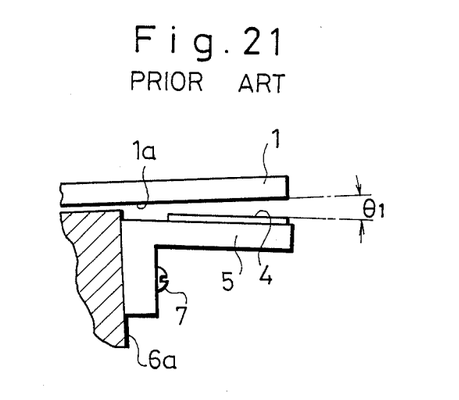

Additionally, Japanese Laying-Open Publication No. 60-72517 of a utility model application proposes to first mount the holding member 5 on the plane 6a and thereafter correct the azimuth angle $\theta_2$ shown in FIG. 21 by an azimuth adjusting mechanism. However, this requires a significant time and effort for azimuth adjustment, and is not suitable for mass-production. It is desired to establish finishing accuracies of the sensor fixing means and mounting reference surface of the holding member by manufacturing the holding member by press-cutting operation also in a magnetic end-surface-reading rotary encoder.

In respect of the holding member 5 of the magnetic rotary encoder, the magnetic sensor 4 produces angular errors $\theta_1$ and $\theta_2$ with respect to the surface carrying the magnetized pattern of the drum or disk used as a magnetic scale unless the sensor fixing surface 5a for adhesively fixing the magnetic sensor 4 is accurately even throughout the substantially entire surface thereof. Further, also when the sensor fixing surface 5a has a sufficient evenness, an uneven thickness of an adhesive used to fix the sensor fixing surface 5a and the magnetic sensor 4 causes the aforegoing angular errors $\theta_1$ and $\theta_2$. Additionally, the magnetic sensor 4 is normally made from glass or ceramic. Therefore, if the holding member 5 is made from metal, the sensor 4 is apt to drop from the holding member 5 due to a difference in thermal expansion coefficient therebetween. It is desired to eliminate angular errors $\theta_1$ and $\theta_2$ caused by unevenness of the sensor fixing surface 5a to adhesively fix the magnetic sensor 4 thereon or by uneven thickness of the adhesive, and also reliably hold the magnetic sensor 4 on the holding member 5 against a change in the temperature.

OBJECT OF THE INVENTION

It is therefore an object of the invention to provide an inexpensive and accurate magnetic rotary encoder by manufacturing the holding member by press-cutting operation, establishing sufficient finishing accuracies of the sensor fixing surface and mounting reference surface.

A second object of the invention is to manufacture the holding member by press-cutting also in an end-surfacereading rotary encoder to provide an inexpensive and accurate encoder.

A third object of the invention is to provide a reliable magnetic rotary encoder in which never produces angular errors $\theta_1$ and $\theta_2$ caused by unevenness of the sensor fixing surface 5a or by uneven thickness of the adhesive used to fix the magnetic sensor 4 to the sensor fixing surface 5a and in which the magnetic sensor 4 never drops from the holding member 5 upon a change in the ambient temperature.

SUMMARY OF THE INVENTION

The invention has the following arrangements to overcome the aforegoing technical problems.

A first arrangement of the invention includes a rotatable magnetic scale; a magnetized pattern provided on a surface of the magnetic scale; a magnetic sensor spaced by a predetermined distance from the magnetized pattern; and a holding member fixing the magnetic sensor and fixed to a mounting surface of a chassis member which rotatably supports the magnetic scale. The holding member includes at least one pair of leg members formed by press-cutting a planar metal plate and contacting the magnetic sensor and/or mounting surface.

A second arrangement of the invention includes a rotatable drum having a magnetized pattern on the circumferential surface thereof; and a magnetic sensor opposed to the drum via a holding member so that any positional change in the magnetized pattern caused by rotation of the drum is detected from an output change in electrical signals from the magnetic sensor. The holding member is press-cut from a metal plate to include a sensor fixing surface supporting the magnetic sensor; a pair of leg members bent from both side margins of the sensor fixing surface and having lower ends which define a mounting reference surface; and a pair of fixture foot members each bent from a portion of each leg member at a level higher than the mounting reference surface. The mounting reference surface is defined by press-cut margins of the holding member obtained by press-cutting the metal plate, and the sensor fixing surface is continuous to the leg members via bent portions which are vertical to a plane including the mounting reference surface.

A third arrangement of the invention includes a rotatable disk having a magnetized pattern on a flat surface thereof; a holding member defining a mounting reference surface vertical to the flat surface of the disk; and a magnetic sensor fixed to the holding member and opposed to the magnetized pattern, so that positional changes in the magnetized pattern caused by rotation of the disk are detected from output changes of electrical signals from the magnetic sensor. The holding member is press-cut from a metal plate to include a sensor fixing surface supporting the magnetic sensor; a pair of leg members bent from both side margins of the sensor fixing surface and having respective ends defining a mounting reference surface; and a pair of fixture foot members each bent from a portion of each leg member along a line spaced from the mounting reference surface. The mounting reference surface is defined by press-cut margins of the holding member obtained by press-cutting the metal plate, and the sensor fixing surface is continuous to the leg members via bent portions which are vertical to a plane including the mounting reference surface.

A fourth arrangement of the invention includes a rotatable member having a magnetized pattern aligned in a circumferential direction; a holding member fixed on a predetermined reference plane outside the rotatable member; and a magnetic sensor fixed to the holding member and opposed to the magnetized pattern, so that positional changes in the magnetized pattern caused by rotation of the rotatable member are detected from output changes of electrical signals from the magnetic sensor. The holding member is made of a metal plate and includes a pair of leg members opposed at a predetermined distance and having two groups of press-cut margins intersecting at a right angle; a fixture member bridging the leg members and bent in an offset fashion with respect to a plane including one group of the press-cut margins; and foot members each bent from each leg member along a line near and spaced from the other group of press-cut margin. The magnetic sensor is adhesively fixed to the fixture member while contacting one group of the press-cut margins, whereas the holding member is fixed by bolts applied to the foot members thereof while the other group of the press-cut margins thereof contacts the reference plane.

A fifth arrangement of the invention includes a rotatable member having a magnetized pattern aligned in a circumferential direction; a holding member fixed on a predetermined reference plane outside the rotatable member; and a magnetic sensor fixed to the holding member and opposed to the magnetized pattern, so that positional changes in the magnetized pattern caused by rotation of the rotatable member are detected from output changes of electrical signals from the magnetic sensor. The holding member is made of a metal plate and includes a pair of leg members opposed at a predetermined distance and having at both ends thereof press-cut margins parallel to each other; a fixture member extending between the leg members and bent in an offset fashion with respect to a plane including one group of the press-cut margins; and foot members each bent from each leg member along a line near and spaced from the other group of the press-cut margins. The magnetic sensor is adhesively fixed to the fixture member while contacting one group of the press-cut margins, whereas the holding member is fixed by bolts applied to the foot members thereof while the other group of press-cut margins thereof contacts the reference plane.

According to the first arrangement, a reliable positioning of the magnetic sensor with respect to the magnetic scale is established by press-cut surfaces of the holding member which contact at least one of the mounting surface and the back surface of the magnetic sensor. Therefore, an encoder having a high detection accuracy is obtained at a lower cost.

According to the second arrangement, the mounting reference surface is defined by a plane connecting a plurality of press-cut margins spaced by predetermined distances. Therefore, an accurate evenness is obtained. Further, since the sensor fixing surface is formed by bending a planar metal workpiece along lines perpendicular to the press-cut margins, an accurate right angle degree is obtained regardless of a change in the bending angles caused by a springback as far as the perpendicularity is maintained. Additionally, since the foot members are formed by bending the leg members at a higher level than the mounting reference surface, the right angle degree of the sensor fixing surface and the evenness of the mounting reference surface are never detracted regardless of possible changes in the insertion amount of the bolts applied to the foot members to fix them to the chassis.

According to the third arrangement, the mounting reference surface is defined by a plane connecting a plurality of press-cut margins spaced by predetermined distances. Therefore, an accurate evenness is obtained. Further, since the sensor fixing surface is formed by bending a planar metal workpiece along lines perpendicular to the press-cut margins, an accurate right angle degree is obtained regardless of a change in the bending angles caused by a springback as far as the perpendicularity is maintained. Additionally, since the foot members are formed by bending the leg members at a level spaced from the mounting reference surface, the right angle degree of the sensor fixing surface and the evenness of the mounting reference surface are never detracted by possible changes in the insertion amount of the bolts applied to the foot members to fix them to the plane.

According to the fourth arrangement, the mounting reference surface of the holding member for contact with the reference plane and the sensor reference surface of the holding member for contact with the magnetic sensor are defined by a plurality of press-cut margins spaced by predetermined distances. Therefore, an accurate right angle relationship between the reference surfaces and an accurate evenness of each reference surface are obtained. Further, the foot members for bolt fixture of the holding member to the reference plane are formed by bending the leg members at a level spaced from the mounting reference surface, the evenness of and the right angle relationship between the mounting reference surface and the sensor reference surface are never detracted regardless of possible changes in the bolt insertion depth. Additionally, the magnetic sensor is not directly fixed to the sensor reference surface. It merely contacts the sensor reference surface and is adhered to a fixture member offset from the sensor reference surface. Therefore, the magnetic sensor seldom drops from the holding member regardless of a relative movement between the holding member and the magnetic sensor upon a change in the ambient temperature.

According to the fifth arrangement, the mounting reference surface of the holding member for contact with a reference plane and the sensor reference surface of the holding member for contact with the magnetic sensor are defined by a plurality of press-cut margins spaced by predetermined distances. Therefore, an accurate right angle relationship between the reference surfaces and an accurate evenness of each reference surface are obtained. Further, the foot members for bolt fixture between the holding member and the reference plane are formed by bending the leg members at a level spaced from the mounting reference surface, the evenness of and the right angle relationship between the mounting reference surface and the sensor reference surface are never detracted regardless of possible changes in the bolt insertion amount. Additionally, the magnetic sensor is not directly fixed to the sensor reference surface. It merely contacts the sensor reference surface and is adhered to the fixture member offset from the sensor reference surface. Therefore, the magnetic sensor seldom drops from the holding member regardless of a relative movement between the holding member and the magnetic sensor upon a change in the ambient temperature.

BRIEF DESCRIPTION OF THE DRAWINGS

FIGS. 1 through 4 illustrate first and second embodiments of the invention, in which

FIGS. 6 through 10 illustrate a third embodiment of the invention, in which

FIGS. 11 through 15 illustrate a fourth embodiment of the invention, in which

DETAILED DESCRIPTION

The invention is hereinbelow described in detail, referring to a first embodiment illustrated in FIGS. 1 through 4, in which parts or members equal to those of the prior art systems are designated by the same or similar reference numerals.

Figure 1:
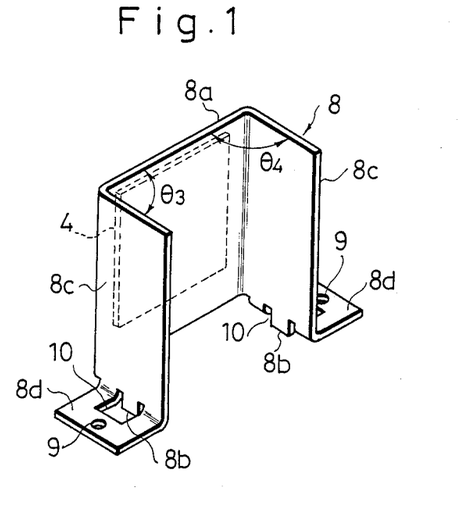
FIG. 1 is a perspective view of a holding member.
Figure 2:
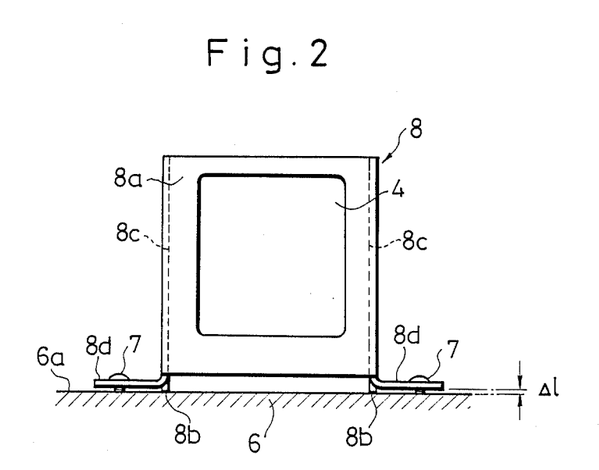
FIG. 2 is a front elevation of the holding member.
Figure 3:
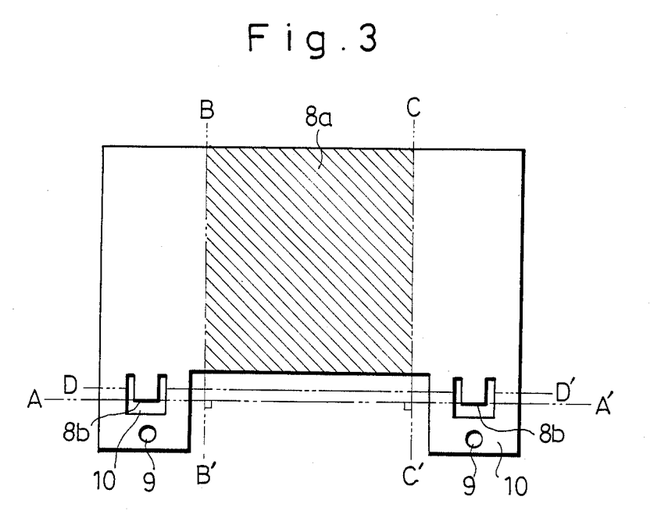
FIG. 3 is a spreading view of the holding member.

FIGS. 1 through 3 illustrate a holding member used in a magnetic rotary encoder according to the first embodiment. FIG. 1 is a perspective view, FIG. 2 is a front elevation, and FIG. 3 is a spreading view.

As shown in FIGS. 1 and 2, the holding member 8 is made by press-cutting a metal plate, and includes a sensor fixing surface 8a to adhesively fix a magnetic sensor 4 thereon, a pair of leg members 8c having lower ends 8b defining a mounting reference surface, and a pair of foot members 8d having mounting bores 9.

Each leg member 8c is bent and extended rearwardly by about 90 degrees from a side margin of the sensor fixing surface 8a. The lower margin of the sensor fixing surface 8a terminates at a higher level than the mounting reference surface ends 8b. Each foot member 8d is bent and extended outwardly by about 90 degrees from the lower margin of the leg member 8c. The lower surfaces of the foot members 8d are also higher than the level of the mounting reference surface 8b.

Around each mounting reference surface end 8b is provided a hole 10 extending across the corner between the leg member 8c and the foot member 8d. One of press-cut margins resulting from the press-cutting of the hole 10 serves as the mounting reference surface 8b.

To manufacture the holding member 8, a flat plate in the form of FIG. 3 is press-cut from a metal plate. The holes 10 are press-cut accurately by a clicking die (die and punch) of a press machine, and a highly accurate cut surface is obtained to define the mounting reference surface 8b. After this, the flat plate is bent by about 90 degrees along two lines B—B' and C—C' which are perpendicular to a line A—A' connecting the press-cut margins 8b, so that planes including the margins 8b extend perpendicular to the plane defined by the lines B—B' and C—C' to be used as the sensor fixing surface 8a. Therefore, the sensor fixing surface 8a becomes perpendicular to the mounting reference surface 8b. In this case, if the bending angles shown by $\theta_3$ and $\theta_4$ in FIG. 1 are not uniform due to a spring-back of the bent portions, no influence is given to the right angle degree of the sensor fixing surface 8a.

Before or after the aforegoing bending operation, the plate of FIG. 3 is bent by 90 degrees approximately along a line D—D' parallel to the line A—A' except portions including the mounting reference ends 8b and located in the holes 10. As the result, the foot members 8d are formed.

The finished holding member 8 shown in FIG. 1 supports the magnetic sensor 4 adhered to the sensor fixing surface 8a thereof, and is thereafter mounted on a plane 6a of a chassis 6, etc. by bolts 7 applied to the mounting holes 9 in the foot members 8d as shown in FIG. 2. Since the leg members 8d are higher by a small Δl (corresponding to the distance between the lines A—A' and D—D' of FIG. 3) than the mounting reference surface 8b, changes in the bolt inserting amount never cause the holding member 8 to incline with respect to the plane 6a. Therefore, the right angle degree of the sensor fixing surface 8a and the evenness of the mounting reference surface 8b which have been accurately finished by press-cutting are also maintained when and after the holding member 8 is mounted on the plane 6a, and a parallel relationship is maintained between the magnetic sensor 4 and the drum (see FIG. 16).

Figure 4:
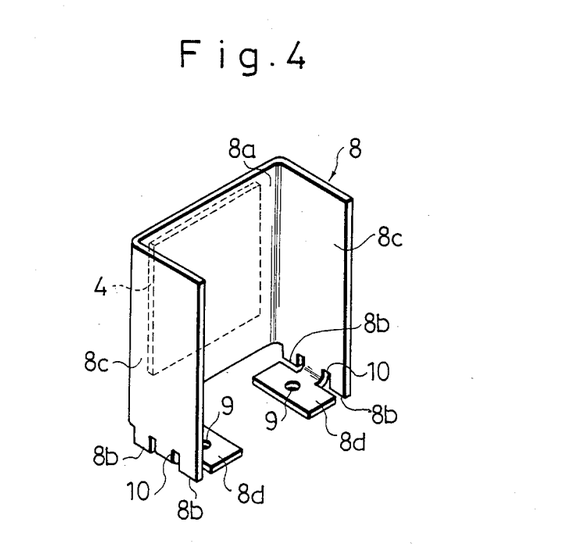
FIG. 4 is a perspective view of another embodiment of the holding member.

FIG. 4 is a perspective view of another form of the holding member 8. The holding member includes four mounting reference ends 8b summing two at the lower end of one leg member 8c and two of the other leg member 8c to improve the reliable fixture of the holding member 8 with respect to the plane 6a. The foot members 8d are bent inwardly from the leg members 8c at a level higher than the mounting reference surface 8b to save the mounting space. The other structural features of the holding member are equal to those of the first embodiment of the invention, and redundant explanation is omitted here. The embodiment also uses the press-cut margins as the mounting reference surface 8b, and establishes high accuracies in the evenness of the plane involving the mounting reference surface 8b and in the right angle degree of the sensor fixing surface 8.

The first embodiment may be changed to have foot members 8d inwardly bent from the leg members 8c, and the second embodiment may be changed to have foot members outwardly bent from the leg members.

The invention was explained above as being used in one type of magnetic rotary encoder in which the magnetized pattern 3 is provided on the outer circumferential surface of the drum 1. However, the invention may be used also in a magnetic rotary encoder in which the magnetized pattern is provided on the inner circumferential surface of a drum having a channel-shaped cross-sectional configuration, and the magnetic sensor is opposed to the inner circumferential surface.

A second embodiment of the invention is hereinbelow described in detail, referring to FIGS. 1 through 5. Parts or members equal to those of the aforegoing embodiment and prior art arrangements are designated by the same or similar reference numerals, and redundant explanation thereof is omitted here.

Figure 5:
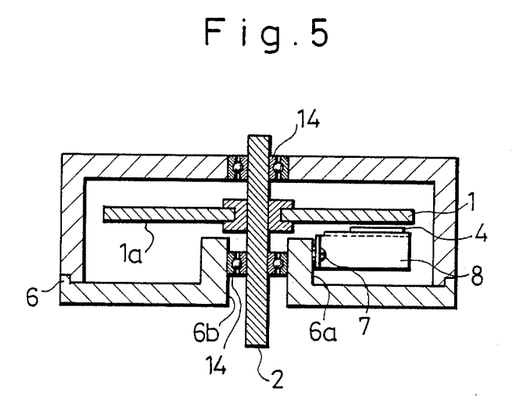
FIG. 5 is a cross-sectional view of a magnetic rotary encoder for explanation of a second embodiment of the invention.

FIG. 5 is a cross-sectional view of a general arrangement of a magnetic rotary encoder embodying the invention. FIGS. 1 through 3 illustrate a holding member used in the magnetic rotary encoder, in which FIG. 1 is a cross-sectional view, FIG. 2 is a front elevation, and FIG. 3 is a spreading view of the holding member.

As shown in FIGS. 1 and 2, the holding member 8 is made by press-cutting a metal plate, and includes a sensor fixing surface 8a to adhesively fix a magnetic sensor 4 thereon, a pair of leg members 8c having lower ends 8b defining a mounting reference surface, and a pair of foot members 8d having mounting bores 9.

Each leg member 8c is bent and extended rearwardly by about 90 degrees from a side margin of the sensor fixing surface 8a. The lower margin of the sensor fixing surface 8a terminates at a higher level than the mounting reference surface ends 8b. Each foot member 8d is bent and extended outwardly by about 90 degrees from the lower margin of the leg member 8c. The lower surfaces of the foot members 8d are also higher than the level of the mounting reference surface 8b.

Around each mounting reference surface end 8b is provided a hole 10 extending across the corner between the leg member 8c and the foot member 8d. One press-cut margins resulting from the press-cutting of the hole 10 serves as the mounting reference surface 8b.

To manufacture the holding member 8, a flat plate in the form of FIG. 3 is press-cut from a metal plate. The holes 10 are press-cut accurately by a clicking die (die and punch) of a press machine, and a highly accurate cut surface is obtained to define the mounting reference surface 8b. After this, the flat plate is bent by about 90 degrees along two lines B—B' and C—C' which are perpendicular to a line A—A' connecting the press-cut margins 8b, so that planes including the press-cut ends 8b extend perpendicular to the plane defined by the lines B—B' and C—C' to be used as the sensor fixing surface 8a. Therefore, the sensor fixing surface 8a becomes perpendicular to the mounting reference surface 8b. In this case, if the bending angles shown in FIG. 1 by $\theta_3$ and $\theta_4$ are not uniform due to a spring-back of the bent portions, no influence is given to the right angle degree of the sensor fixing surface 8a.

Before or after the aforegoing bending operation, the plate of FIG. 3 is bent by 90 degrees approximately along a line D—D' parallel to the line A—A', except portions including the mounting reference surfaces 8b and located in the holes 10. As the result, the foot members 8d are formed.

The finished holding member 8 in the form of FIG. 1 supports the magnetic sensor 4 adhered at a proper position on the sensor fixing surface 8a thereof, and is thereafter mounted on a plane 6a of a case 6, etc. by bolts 7 applied to the mounting holes 9 in the foot members 8d as shown in FIG. 5. Assume here that the plane 6 is finished accurately to establish an accurate right angle configuration with respect to the disk surface 1a of the disk 1 as described above. Since the foot members 8d are spaced by a small amount Δl (corresponding to the distance between the lines A—A' and D—D' of FIGS. 3) from the mounting reference surface 8b as shown in FIG. 2, changes in the bolt inserting amount never cause the holding member 8 to incline with respect to the plane 6a. Therefore, the right angle degree of the sensor fixing surface 8a and the evenness of the mounting reference surface 3b which have been accurately finished by press-cutting operation are also maintained when and after the holding member 8 is mounted on the plane 6a, and the magnetic sensor 4 is reliably supported parallely and without azimuth error with respect to the disk surface 1a of the disk 1.

FIG. 4 is a perspective view of another form of the holding member 8. The holding member includes four mounting reference ends 8b summing two at the lower and of one leg member 8c and two of the other leg member 8c, to improve the fixture reliability of the holding member 8 with respect to the plane 6a. The foot members 8d are bent inwardly from the leg members 8a at a level higher than the mounting reference surface 8b to save the mounting space. The other structural features of the holding member 8 are equal to those of the first embodiment of the invention, and redundant explanation is omitted here. The embodiment also uses the press-cut margins as the mounting reference surface 8b, and establishes high accuracies in the evenness of the plane involving the mounting reference surface 8b and in the right angle degree of the sensor fixture surface 8.

The first embodiment was explained as extending the foot members 8d outwardly of the leg members 8c, but the foot members 8d may be extended inwardly of the leg members 8c. Similarly, the foot members 8d in the second embodiment may be changed to extend outwardly of the leg members 8c.

A third embodiment of the invention is hereinbelow described in detail, referring to FIGS. 6 through 10. Parts or members equal to those of the aforegoing embodiments and prior art arrangements are designated by the same or similar reference numerals, and redundant explanation thereof is omitted here.

Figure 6:
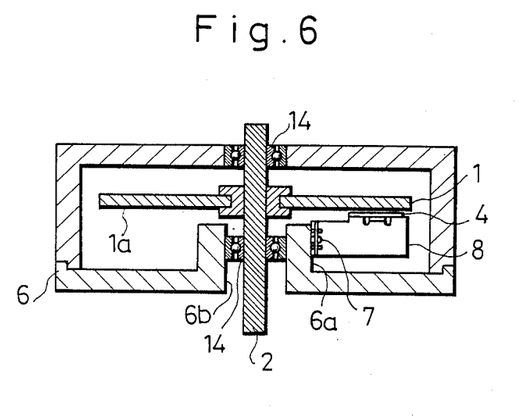
FIG. 6 is a cross-sectional view of a magnetic rotary encoder.
Figure 7:
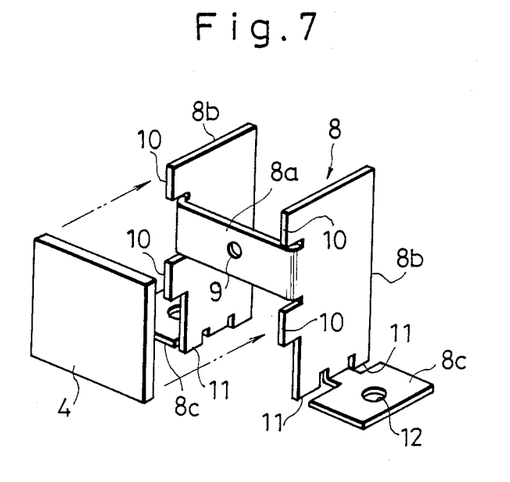
FIG. 7 is an exploded cross-sectional view of a holding member and a magnetic sensor.
Figure 8:
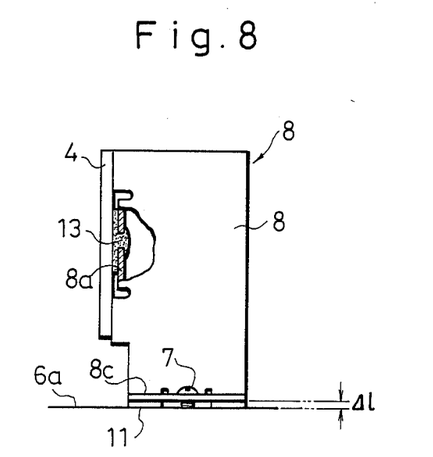
FIG. 8 is side elevation of the holding member and the magnetic sensor of FIG. 7 including a partial cross-sectional view.

FIG. 6 is a cross-sectional view of a general arrangement of a magnetic rotary encoder embodying the invention. FIG. 7 is a perspective view of a holding member and a magnetic sensor used in the magnetic rotary encoder, FIG. 8 is a side elevation including a partial cross-sectional view to show the assembled state of the holding member, and FIG. 9 is a spreading view of the holding member.

As shown in FIGS. 6 through 9, the holding member 8 is made by press-cutting a metal plate, and includes an elongated rectangular fixture member 8a having a through bore 9 in the center thereof; a pair of leg members 8b having side margins defining a sensor reference surface 10 thereof and lower ends defining a mounting reference surface 11; and a pair of foot members 8c having mounting bores 12.

Each leg member 8b is bent and extended rearwardly by about 90 degrees from a side margin of the fixture member 8a. Each foot member 8c is bent and extended outwardly by about 90 degrees from the lower margin of the leg member 8b. The lower surfaces of the foot members 8c are higher than the level of the mounting reference surface 11. The fixture member 8a is slightly offset rearwardly from the plane including the sensor reference surface 10.

Figure 9:
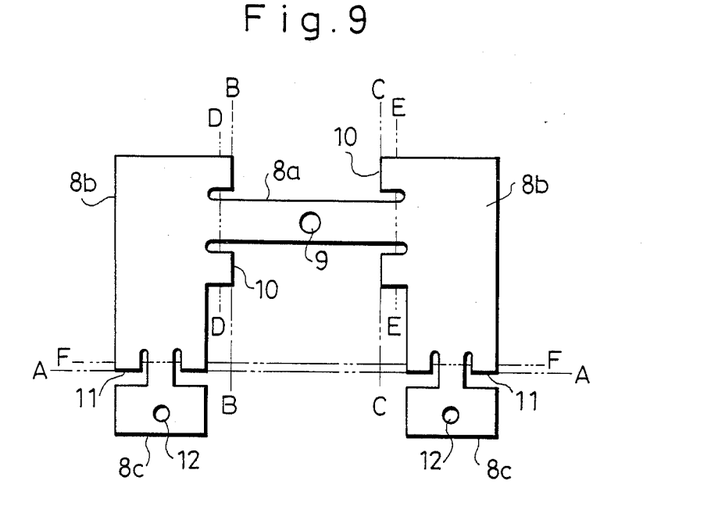
FIG. 9 is a spreading view of the holding member of FIG. 7.

To manufacture the holding member 8, a flat plate in the form of FIG. 9 is press-cut from a metal plate. Three press-cut margins A—A, B—B and C—C resulting from the press-cutting operation are such that the lines B—B and C—C are perpendicular to the line A—A. Since the parallel or perpendicular relationships of the press-cutting lines are determined by a clicking die (die and punch) of a press machine, highly accurate relationships are established. The cut margin A—A defines the mounting reference surface 11, and the cut margins B—B and C—C define the sensor reference surface 10. After this, the flat plate of FIG. 9 is bent by about 90 degrees along two lines D—D and E—E which are parallel to the cut margins B—B and C—C, so that the central rectangular plane surrounded by the lines serves as the fixture member 8a whereas the both lateral rectangular planes define the leg members 8b.

Before or after the aforegoing bending operation, the plate of FIG. 9 is bent by 90 degrees approximately along a line F—F parallel to the cut margin A—A to define the foot members 8c at the lower ends of the foot members 8b. The bending angles will vary more or less due to a spring-back of the bent portions. However, this never gives any influence to the right angle degree between the sensor reference surface 10 and the mounting reference surface 11 or other structural importances.

After the holding member 8 in the form of FIG. 7 is obtained from a metal plate, the magnetic sensor 4 is put on the holding member 8 with its rear surface contacting the sensor reference ends 10, and an adhesive member 13 is applied through the bore 9 of the fixture member 8a to adhesively fix the magnetic sensor 4 to the fixture member 8a (see FIG. 8). After this, bolts 7 are applied to the mounting holes 12 of the foot members 8c to fix the holding member 8 to a reference plane 6a of a case 6. Assume here that the plane 6a is finished accurately to establish an accurate right angle configuration with respect to the disk surface 1a of the disk 1 via a shaft hole 6b. Since the foot members 8c are spaced by a small amount Δl (corresponding to the distance between the lines A—A and F—F of FIG. 9) from the mounting reference surface 11, more or less changes in the bolt inserting amount never cause the holding member 8 to incline with respect to the reference plane 6a. Therefore, the right angle degree of the sensor reference surface 10 and mounting reference surface 11 or their individual evenness which have been accurately finished by press-cutting operation are also maintained when and after the holding member 8 is mounted on the plane 6a and the magnetic sensor 4 is reliably supported parallely and without azimuth error with respect to the disk surface 1a of the disk 1. Further, regardless of any relative movement between the magnetic sensor 4 and the holding member 8 due to their different thermal expansions upon a change in the ambient temperature, the relative movement is absorbed by slidable movements of the sensor reference surfaces 10 along the rear surface of the magnetic sensor 4 because the magnetic sensor 4 is partly adhered at a central portion thereof to the fixture member 8a, and the magnetic sensor seldom drops from the holding member 8.

Figure 10A:
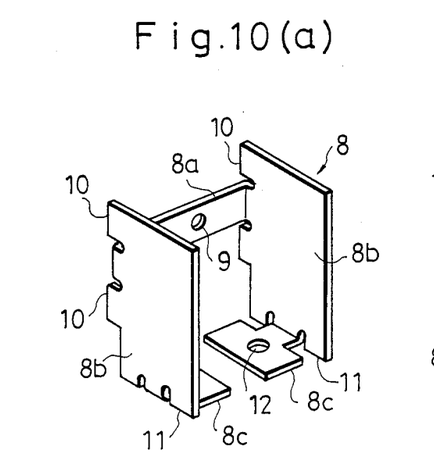
FIGS. 10(a) and 10(b) are perspective views of other embodiments of the holding member of FIG. 7.
Figure 10B:
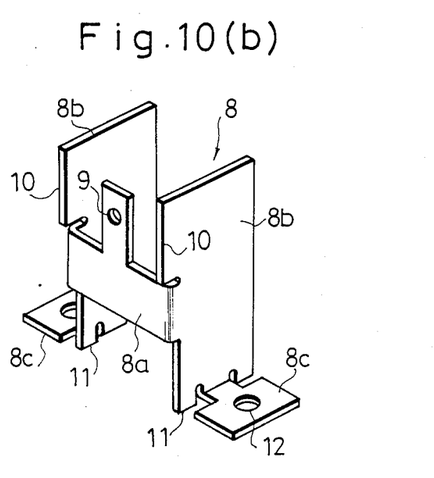

The configurations and positions of the fixture member 8a or foot members 8c may be changed adequately. For example, the foot members 8c may be bent inwardly of the leg members 8b to save the mounting space as shown in FIG. 10(a). The fixture member 8a may have an upset T-shaped configuration having the through hole 9 in the central extension thereof located at the center of the sensor reference surface 10. In these modifications, the same results as from the first embodiment are obtained by defining the sensor reference surface 10 and the mounting reference surface 11 by the press-cut margins and by bending the fixture member 8a and the foot members 8c along lines spaced from the press-cut margins.

The first embodiment was explained as using the disk 1 as the magnetic recording medium having the magnetized pattern 3. However, the invention may be used in a magnetic recording medium in which the magnetized pattern is provided along the circumference of a drum-shaped rotary member. In this case, the holding member 8 will be mounted on a reference plane which is perpendicular to the rotary shaft of the magnetic recording medium.

A fourth embodiment of the invention is hereinbelow described in detail, referring to FIGS. 11 through 15. Parts or members equal to those of the aforegoing embodiments and prior art arrangements are designated by the same or similar reference numerals, and redundant explanation thereof is omitted here.

Figure 11:
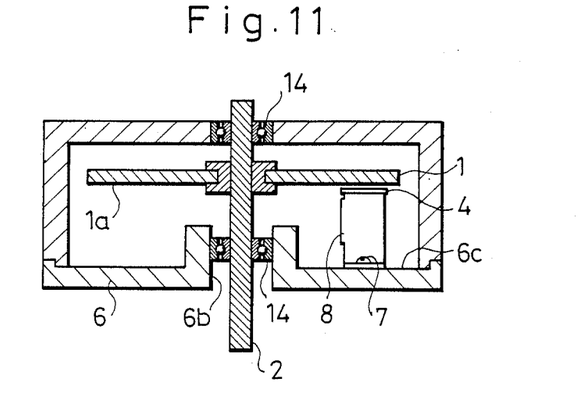
FIG. 11 is a cross-sectional view of a magnetic rotary encoder.
Figure 12:
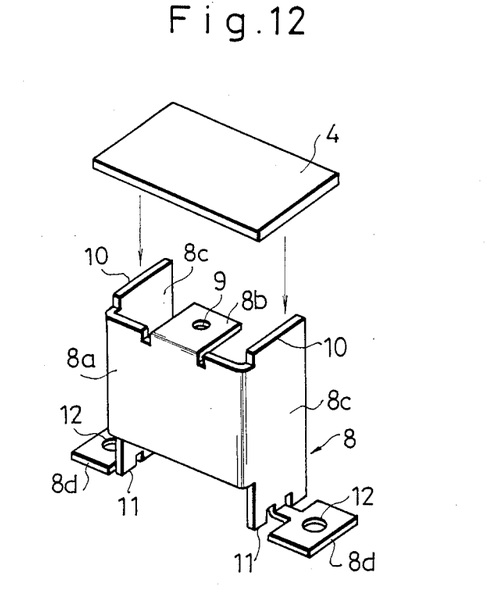
FIG. 12 is an exploded perspective view of a holding member and a magnetic sensor of FIG. 11.

FIG. 11 is a cross sectional view of a general arrangement of a magnetic rotary encoder embodying the invention. FIG. 12 is a perspective view of a holding member and a magnetic sensor used in the magnetic rotary encoder, FIG. 13 is a side elevation including a partial cross-sectional view to show the assembled state of the holding member, and FIG. 14 is a spreading view of the holding member.

Figure 13:
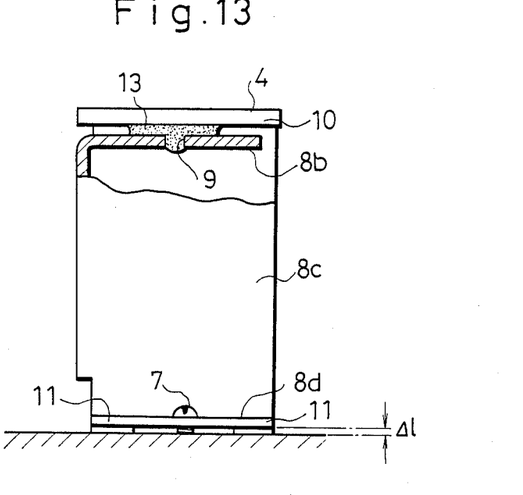
FIG. 13 is a side elevation of the conjoined assembly of the holding member and magnetic sensor of FIG. 11, including a partial cross-sectional view.

As shown in FIGS. 11 through 13, the holding member 8 made by press-cutting a metal plate, and includes a connecting member 8a having a rectangular configuration; a fixture member 8b having a through hole 9; a pair of leg members 8c defining a sensor reference surface 10 at upper ends and a mounting reference surface 11 at lower ends thereof; and a pair of foot members 8d having mounting holes 12.

Each leg member 8c is bent and extended rearwardly by about 90 degrees from a side margin of the connecting member 8a. Each foot member 8d is bent and extended outwardly by about 90 degrees from the lower margin of the leg member 8c. The lower surfaces of the foot members 8c are higher than the level of the mounting reference surface 11. The fixture member 8b is bent and extended by about 90 degrees from the upper margin of the connecting member 8a, and its upper surface is lower than the level of the sensor reference surface 10.

Figure 14:
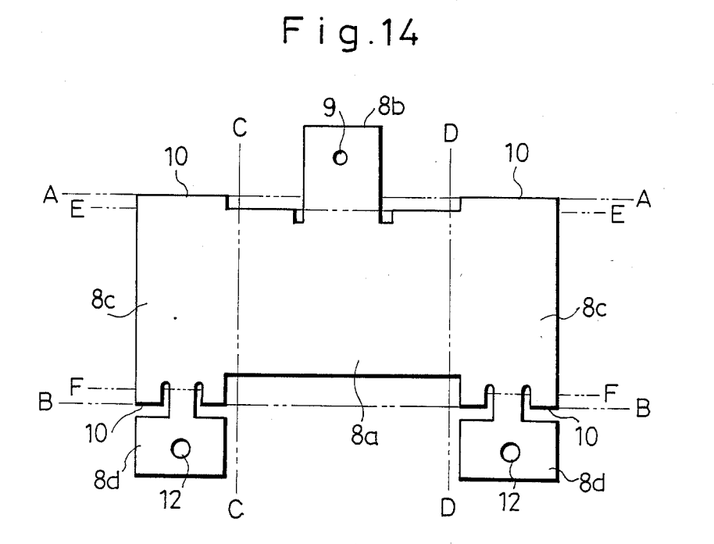
FIG. 14 is a spreading screw of the holding member of FIG. 11.

To manufacture the holding member 8, a flat plate in the form of FIG. 14 is press-cut from a metal plate. Two press-cut margins A—A and B—B are parallel to each other. Since these margins are defined by a clicking die (die and punch) of a press machine, highly accurate press-cut margins are obtained. The press-cut margin A—A defined the sensor reference surface 10, and the margin B—B defines the mounting reference surface 11. After this, the flat plate of FIG. 14 is bent by about 90 degrees along two lines C—C and D—D which are parallel to the press-cut margins A—A and B—B, so that the central rectangular plane surrounded by the lines forms the connecting member 8a, whereas the both lateral rectangular planes define the leg members 8c.

Before or after the aforegoing bending operation, the plate of FIG. 14 is bent by 90 degrees along lines E—E and F—F which are parallel to the press-cut margins A—A and B—B to define the fixture member 8b by the bending line E—E and the foot members 8d by the bending line F—F. The bending angles will vary more or less due to a spring-back of the bent portions. However, this never gives any influence to the parallel or other relationship between the sensor reference surface 10 and the mounting reference surface 11.

After the holding member 8 in the form of FIG. 12 is obtained from a metal plate, the magnetic sensor 4 is put on the holding member with its rear surface contacting the sensor reference surface 10, and an adhesive member 13 is applied through the bore 9 of the fixture member 8b to adhesively fix the magnetic sensor 4 to the fixture member 8b (see FIG. 13). After this, bolts 7 are applied to the mounting holes 12 of the foot members 8d to fix the holding member 8 to a reference plane 6c of a case 6. Assume here that the plane 6c is finished accurately to establish an accurate right angle configuration with respect to the disk surface 1a of the disk 1 via a shaft hole 6b. Since the foot members 8d are spaced by a small distance Δl (corresponding to the distance between the lines B—B and F—F) from the mounting reference surface 11, more or less possible changes in the bolt inserting amount never cause the holding member 8 to incline with respect to the reference plane 6c. Therefore, the parallel relationship between the sensor reference surface 10 and the mounting reference surface 11 or their respective evenness which have been accurately finished by press-cutting are also maintained when and after the holding member 8 is mounted on the case 6, and the magnetic sensor 4 is reliably supported parallely and without azimuth error with respect to the disk surface 1a of the disk 1. Further, regardless of any relative movement between the magnetic sensor 4 and the holding member 8 due to their different thermal expansions upon a change in the ambient temperature, the relative movement is absorbed by slidable movement of the sensor reference ends 10 along the rear surface of the magnetic sensor 4 because the magnetic sensor 4 is partly adhered at a central portion thereof to the fixture member 8a, and the magnetic sensor seldom drops from the holding member 8.

Figure 15A:
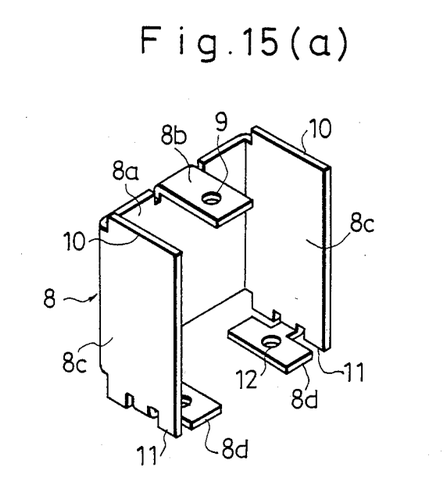
FIGS. 15(a) and 15(b) are perspective views of other embodiments of the holding member of FIG. 11.
Figure 15B:
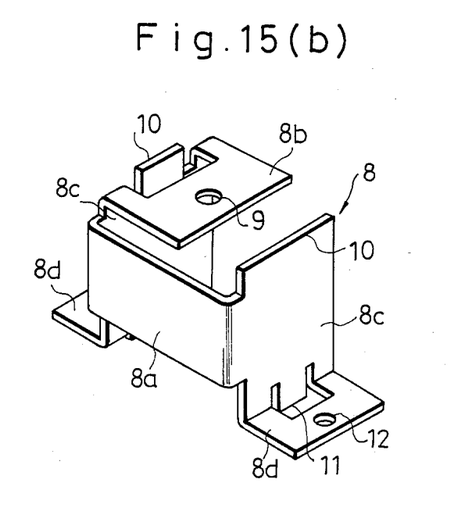

The configurations and positions of the fixture member 8b or foot members 8d may be bent inwardly of the leg members 8c to save the mounting space as shown in FIG. 15(a). The fixture member 8b may be formed by bending an upper portion of one of the leg members 8c as shown in FIG. 15(b). In these modifications, the same results as from the first embodiment are obtained by defining the sensor reference surface 10 and the mounting reference surface 11 by the press-cut margins and by bending the fixture member 8b and the foot members 8d along lines spaced from the press-cut margins.

The first embodiment was explained as using the disk 1 as the magnetic recording medium having the magnetized pattern 3. However, the invention may be used in a magnetic recording medium in which the magnetized pattern is provided along the circumference of a drum-shaped rotary member. In this case, the holding member 8 will be mounted on a reference plane which is parallel to the rotary shaft of the magnetic recording medium.

In the described embodiments, press-cut margins are used to properly position the holding member or to position the holding member and the magnetic sensor. However, the use of the press-cut margins will be limited to assemblage of the magnetic sensor in some magnetic rotary encoders in which other capabilities are expected.

In conclusion, according to an invention arrangement in which the magnetic sensor and/or holding member is properly positioned and fixed by contacting press-cut margins of the holding member to a supporting surface, expensive finishing of the contacting surfaces of the holding member is not required unlike the prior art arrangement, and this contributes to a reliable, accurate and inexpensive mounting operation of the magnetic sensor.

According to the second invention arrangement, the holding member can be manufactured by press-cutting process suitable for mass production, without losing the right angle degree of the sensor mounting surface and the evenness of the mounting reference surface. Therefore, a magnetic rotary encoder having a high detection accuracy is provided at a lower cost.

According to the third invention arrangement, the holding member used in a disk-surface-reading encoder can be manufactured by press-cutting suitable for mass production, without losing the right angle degree of the sensor mounting surface and the evenness of the mounting reference surfaces. Therefore, a magnetic rotary encoder having a high detection accuracy is provided at a lower cost.

The fourth and fifth invention arrangements not only establishes required right angle degree and evenness of the holding member using press-cut margins of the holding member, but also reliably fixes the magnetic sensor to the holding member regardless of a change in the temperature. Therefore, a magnetic rotary encoder having a high detection accuracy is obtained at a lower cost.

What is claimed is:

1. A holding member for holding a sensor accurately in a prescribed sensing position in a magnetic rotary encoder, wherein the holding member is to be mounted on a plane surface of a chassis of the magnetic rotary encoder such that the sensor is in the prescribed sensing position in a predetermined relationship to said plane surface of said chassis, comprising:
    a sensor mounting surface for fixing the sensor thereon in the prescribed sensing position;
    a pair of leg members, each having a given width, which are spaced apart in parallel and connected to support said sensor mounting surface from opposing sides thereof, and which have respective parallel end portions extending perpendicularly toward said plane surface of said chassis;
    each end portion of said pair of leg members having a lower end edge projecting from one part thereof along the given width of the respective leg member to abut on respective opposing sides on said plane surface of said chassis, and a foot member formed by another part of said end portion which is cut around said lower end edge and bent perpendicular to the respective leg member in parallel with said plane surface of said chassis at a level slightly above said plane surface; and
    said foot members of said leg members having respective mounting means for mounting said holding member to said plane surface of said chassis, said lower end edges of said leg members thereby defining a mounting reference surface for said holding member which is coplanar with said plane surface of said chassis and slightly spaced below the level of said foot members, whereby said lower end edges can accurately position said sensor fixed to said sensor mounting surface in the prescribed sensing position despite any misalignment of said leg members with respect to said sensor mounting surface and any deviation of said mounting means of said foot members with respect to said plane surface of said chassis.

2. A holding member according to claim 1, wherein all of said sensor mounting surface, leg members, lower end edges and foot members are formed from a single metal plate.

3. A holding member according to claim 2, wherein said sensor mounting surface is aligned perpendicularly to said plane surface of said chassis, and said leg members are formed as respective opposing side portions of said metal plate bent back 90° on each side of said sensor mounting surface.

4. A holding member according to claim 2, wherein said sensor mounting surface is aligned in parallel and spaced by a predetermined height above said plane surface of said chassis, and said leg members are formed as respective opposing side portions of said metal plate bent back 90° from an intermediate connecting member and have respective upper edges in parallel to said sensor mounting surface, said sensor being mounted in the prescribed sensing position in parallel to said plane surface of said sensor mounting surface and said upper edges of said leg members.

* * * * *